Figure 1:
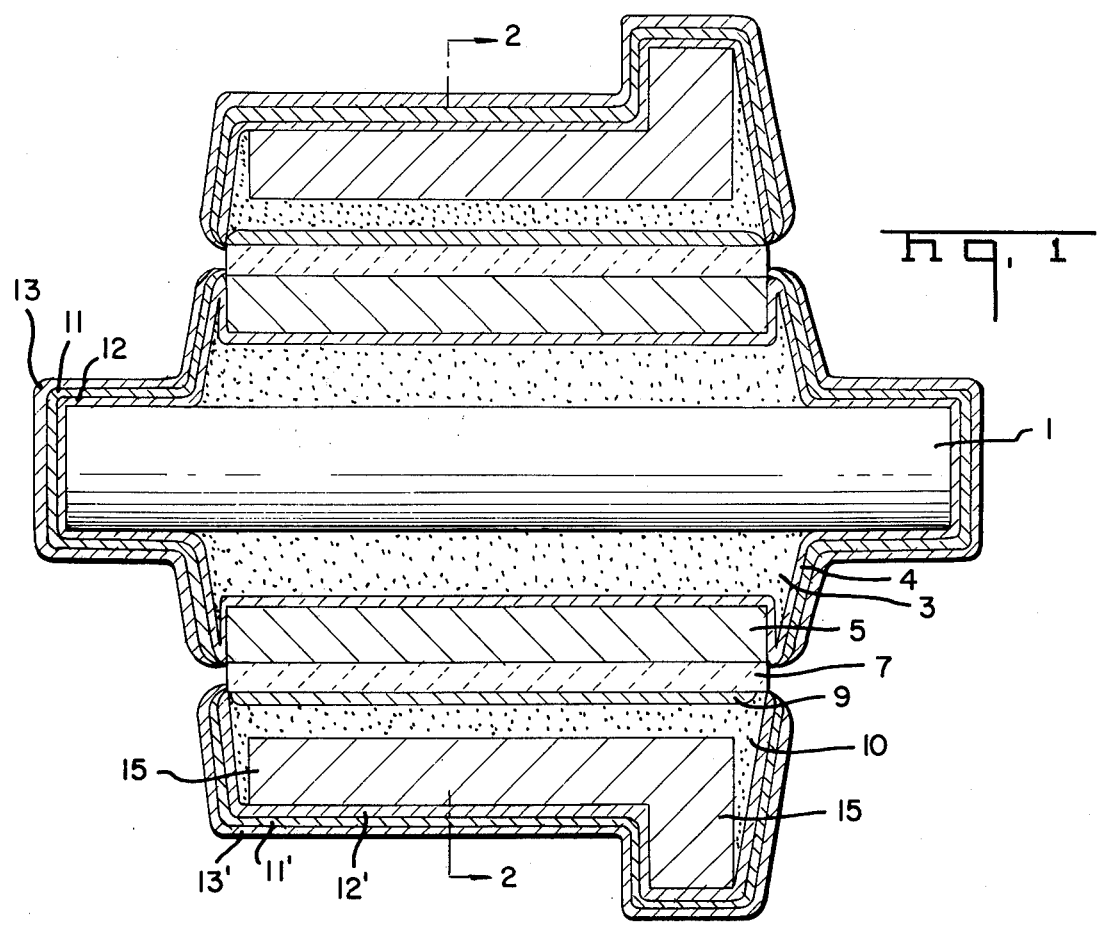

United States Patent
Hudson, Jr.

[11] 3,987,380
[45] Oct. 19, 1976

[54] PLATING ENCAPSULATION TO INHIBIT DENDRITIC GROWTH

[75] Inventor: William Jeffrey Hudson, Jr., Hershey, Pa.

[73] Assignee: AMP Incorporated, Harrisburg, Pa.

[22] Filed: Sept. 12, 1974

[21] Appl. No.: 505,429

[52] U.S. Cl. ............................ 333/79; 333/70 R; 333/70 S
[51] Int. Cl.² ................. H03H 7/04; H01G 4/42; H01G 1/10
[58] Field of Search ............. 333/79, 70 R, 70 S; 317/258, 259; 204/196, 197; 128/419 R, 419 P, 420

[56] References Cited
UNITED STATES PATENTS

| | | | |
|---|---|---|---|
| 3,333,045 | 7/1967 | Fisher et al. | 128/419 P |
| 3,416,533 | 12/1968 | Fisher et al. | 128/419 P |
| 3,568,660 | 3/1971 | Crites | 128/419 P X |

OTHER PUBLICATIONS
Walkiden–"Platinum in Anodes Cathodic Protection Applications–Part 1" in Corrosion Technology Jan. 1962; pp. 14–16.

*Primary Examiner*—Eli Lieberman
*Assistant Examiner*—Marvin Nussbaum
*Attorney, Agent, or Firm*—Gerald K. Kita

[57] ABSTRACT

The disclosure relates to EMI filters and the like wherein the possibility of dendrite formation between electrodes is substantially eliminated. This is accomplished by encasing any material forming a part of the filter or the like which is capable of supporting dendrite growth within a material that does not support the growth of dendrites so that any ionized moisture medium cannot come into intimate contact with the material capable of supporting dendrite growth and so that there is no direct path from one dendrite growth supporting electrode across the medium to the other dendrite growth supporting electrode. The encasing material is preferably gold, aluminum or platinum.

4 Claims, 2 Drawing Figures

U.S. Patent

Oct. 19, 1976

3,987,380

PLATING ENCAPSULATION TO INHIBIT DENDRITIC GROWTH

This invention relates to electrical components wherein the growth of dendrites is substantially inhibited and, more specifically, to such components wherein materials capable of supporting dendrite growth are isolated from any ionized moisture media.

It is known in the art that when two electrodes are placed in an ionized solution wherein a potential difference is applied across the electrodes, the ions in solution will travel to the electrode of opposite polarity. Upon reaching the electrode the ions will be neutralized and deposit as a solid or go off as a gas. When these neutralized ions deposit, they can form dendrites. A dendrite is the treeing effect across a flat medium between two electrodes that indicates that a metal or scale is being deposited due to an electrochemical plating reaction. The dendrites can form on the dielectric and reach from one electrode to the other. This is caused by a plating action wherein the electrolyte with a voltage present forms a soluble salt with the electrode or other materials present, such as solders or the like. This action can continue until there is an electrical short circuit present.

The prior art has attempted to overcome this problem by hermetically sealing the electrical component to prevent the introduction of moisture therein. However, since no hermetic seal is perfect, moisture will eventually enter the component. This is particularly true in the case of electrical components which are placed in the human body, such as in heart pacemakers, wherein the body solutions continually surround and eventually enter the electrical component. In fact, the moisture actually entering the component in the human body is pure water. An attempt has been made to prevent ionization in this water by perfect cleaning of the components. However, this is not possible, so an ionized solution will form and cause dendrite formation, even at a slow rate. While this slow rate of dendrite growth can often be tolerated, this is not true in the case of heart pacemakers where the component must operate in an assured trouble-free manner for extended periods of time. It is therefore necessary to prevent dendrite formation, even slowly, especially in electrical components which will be placed in an aqueous media, such as the saline human body fluids.

The prior art has indicated that dendrites can be made to form from all metals with the exception of aluminum, platinum and gold, though other presently unknown materials may also not support dendrite growth. Accordingly, in accordance with the present invention, the above noted problems of the prior art are substantially eliminated. Briefly, this is accomplished by encasing any materials capable of supporting dendrite growth within a material which does not support dendrite growth, such as gold, platinum or aluminum with proper moisture barriers and proper materials to insure plating adherence, if necessary. In this way, moisture is blocked from dendrite forming materials to the extent possible, and even if such moisture penetrates the moisture barrier, the materials closest to the surface will be non-dendrite forming metals.

It is therefore an object of this invention to provide electrical components wherein dendrite growth is substantially inhibited.

It is a further object of this invention to provide a system for substantially eliminating dendrite growth in electrical components placed within the human body.

It is still further an object of this invention to provide electrical components wherein all dendrite forming metals are encased in metals that do not form dendrites.

Figure 2:
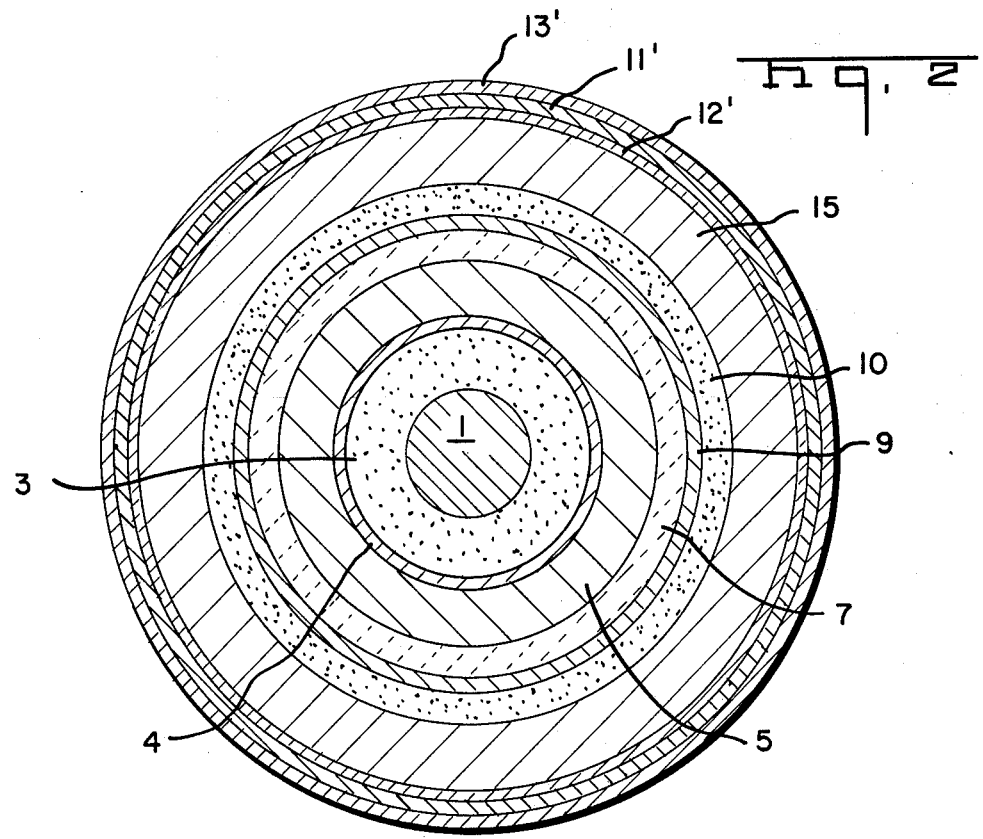

The above objects and still further objects of the invention will immediately become apparent to those skilled in the art after consideration of the following preferred embodiment thereof, which is provided by way of example and not by way of limitation, wherein:

FIG. 1 is a cross-sectional view of a filter constructed in accordance with the present invention; and FIG. 2 is a view taken along the line 2—2 of FIG. 1.

Referring to the FIGURES, there is shown an EMI filter constructed in accordance with the present invention. The filter includes a pin 1, preferably formed of copper or other electrically conductive metal, the pin passing through the hollow interior of a ferrite sleeve 5, plated with a copper plating 4 and secured to the plating by solder 3 which can be 10% tin and 90% lead, for example, or any other appropriate solder. A ceramic layer 7, which is preferably a titanate or mixture of titanates, such as, for example, barium titanate or a mixture of magnesium and strontium titanates, is coated on the ferrite sleeve 5.

To complete a standard prior art filter of the type shown and described, for example, in U.S. Pat. No. 3,743,978 of William Baird Fritz, an electrically conductive layer would be formed over the ceramic with an eyelet or other appropriate electrical connector device soldered to the copper plating 9 thereto. It can be seen that such a structure, in actual use, would have a potential difference across the solder 3 and the solder 10 holding the eyelet to the outer electrically conductive plating layer 9 over the ceramic. It is therefore apparent that dendrite formation can take place if the proper moisture conditions are present with the eventual possible short circuiting of the pin 1 to the outer conducting eyelet 15 across the ceramic 7. This situation is substantially eliminated herein.

As can be seen, again with reference to the FIGURES, there are gold layers 13 and 13' deposited over the nickel layers 11 and 11' which are deposited over the copper layers 12 and 12' encasing the solder 10 and brass eyelet 15 encasing the solder 3 and pin 1. Only a portion of the end of the ceramic layer is exposed. The nickel layers 11 and 11' are deposited between the copper layers 12 and 12' and gold layers 13 and 13', if necessary, to act as a moisture barrier. It can be seen that the solder as well as the eyelet are now encased in the gold to the extent that an ionized moisture medium cannot come into intimate contact with two regions capable of forming dendrites which are at different electrical potentials. Also, there is no direct path from one possible electrode through a dielectric path to the other possible electrode, the dielectric only seeing a gold surface.

It should be understood that all parts should be cleaned during fabrication to minimize the presence of conforming inpurities.

Typical layer thicknesses for the gold layers 13 and 13' would be from about 0.000015 to about 0.000050 inches. Typical layer thickness for the nickel layers 11 and 11' would be from about 0.000200 to about 0.000070 inches. Typical layer thicknesses for the copper layers 12 and 12' would be from about 0.000200 to about 0.000070 inches.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. An electrical filter device adapted for use in an aqueous medium, comprising:
    a sleeve for ferrite material having a conductive inner layer,
    a layer of ceramic material encircling said sleeve,
    a conductive material layer encircling said ceramic material,
    a conductive electrical connector encircling said conductive material layer and being joined to said conductive material layer with solder to form a first electrode,
    a conductive pin received through said sleeve and being joined to said conductive inner layer with solder to form a second electrode separated from said first electrode by said layer of ceramic material,
    said second electrode adapted to operate at a different electrical potential than that of said first electrode,
    said first and second electrodes each having an outer coating of conductive material which is incapable of supporting thereon electrode deposition of ions in solution within an aqueous medium and which is selected from the group consisting of aluminum, platinum and gold.

2. The structure as recited in claim 1, wherein, said pin is copper.

3. The structure as recited in claim 1, wherein, said ceramic material is a ceramic titanate.

4. An electrical filter device adapted for use in an aqueous medium comprising:
    a sleeve of ferrite material having a conductive inner layer,
    a layer of ceramic material encircling said sleeve,
    a conductive material layer encircling said ceramic material,
    a conductive electrical connector encircling said conductive material layer and being joined to said conductive material layer with solder to form a first electrode,
    a conductive pin received through said sleeve and being joined to said conductive inner layer with solder to form a second electrode separated from said first electrode by said layer of ceramic material,
    said second electrode adapted to operate at a different electrical potential than that of said first electrode,
    said first and second electrodes each having a plated layer of nickel thereover, and
    an outer plating encasing each said layer of nickel selected from the group consisting of gold, platinum and aluminum.

* * * * *